(12) United States Patent
Shah et al.

(10) Patent No.: US 10,121,759 B2
(45) Date of Patent: Nov. 6, 2018

(54) ON-BONDER AUTOMATIC OVERHANG DIE OPTIMIZATION TOOL FOR WIRE BONDING AND RELATED METHODS

(71) Applicant: Kulicke and Soffa Industries, Inc., Fort Washington, PA (US)

(72) Inventors: Aashish Shah, Horsham, PA (US); Robert William Ellenberg, Philadelphia, PA (US); Stephen Babinetz, Lansdale, PA (US); Ziauddin Ahmad, Villanova, PA (US); Wei Qin, Lansdale, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 53 days.

(21) Appl. No.: 15/234,563

(22) Filed: Aug. 11, 2016

(65) Prior Publication Data

US 2017/0125311 A1   May 4, 2017

Related U.S. Application Data

(60) Provisional application No. 62/250,745, filed on Nov. 4, 2015.

(51) Int. Cl.
*H01L 21/66* (2006.01)
*H01L 23/00* (2006.01)

(52) U.S. Cl.
CPC .............. *H01L 24/78* (2013.01); *H01L 24/85* (2013.01); *H01L 24/32* (2013.01); *H01L 24/48* (2013.01); *H01L 24/73* (2013.01); *H01L 24/92* (2013.01); *H01L 2224/32014* (2013.01); *H01L 2224/32145* (2013.01); *H01L 2224/32225* (2013.01); *H01L 2224/48095* (2013.01); *H01L 2224/48227* (2013.01); *H01L 2224/48465* (2013.01); *H01L 2224/73265* (2013.01); *H01L 2224/78001* (2013.01); *H01L 2224/78901* (2013.01); *H01L 2224/859* (2013.01); *H01L 2224/85181* (2013.01); *H01L 2224/92247* (2013.01); *H01L 2924/00014* (2013.01)

(58) Field of Classification Search
CPC ..................... H01L 24/78; H01L 24/85; H01L 2224/32014; H01L 2224/32225; H01L 2224/48095; H01L 24/32; H01L 24/73; H01L 2224/32145; H01L 24/92; H01L 2224/48227; H01L 2224/92247; H01L 2224/859; H01L 2224/08

See application file for complete search history.

(56) References Cited

U.S. PATENT DOCUMENTS

| 8,302,840 B2 | 11/2012 | Qin et al. | |
|---|---|---|---|
| 2012/0074206 A1* | 3/2012 | Qin | H01L 22/20 228/102 |

* cited by examiner

*Primary Examiner* — Selim Ahmed
(74) *Attorney, Agent, or Firm* — Christopher M. Spletzer, Sr.

(57) ABSTRACT

A method of providing a z-axis force profile applied to a plurality of bonding locations during a wire bonding operation is provided. The method includes: (a) determining a z-axis force profile for each of a plurality of bonding locations on an unsupported portion of at least one reference semiconductor device; and (b) applying the z-axis force profile during subsequent bonding of a subject semiconductor device. Methods of: determining a maximum bond force applied to a bonding location during formation of a wire bond; and determining a z-axis constant velocity profile for formation of a wire bond, are also provided.

11 Claims, 9 Drawing Sheets

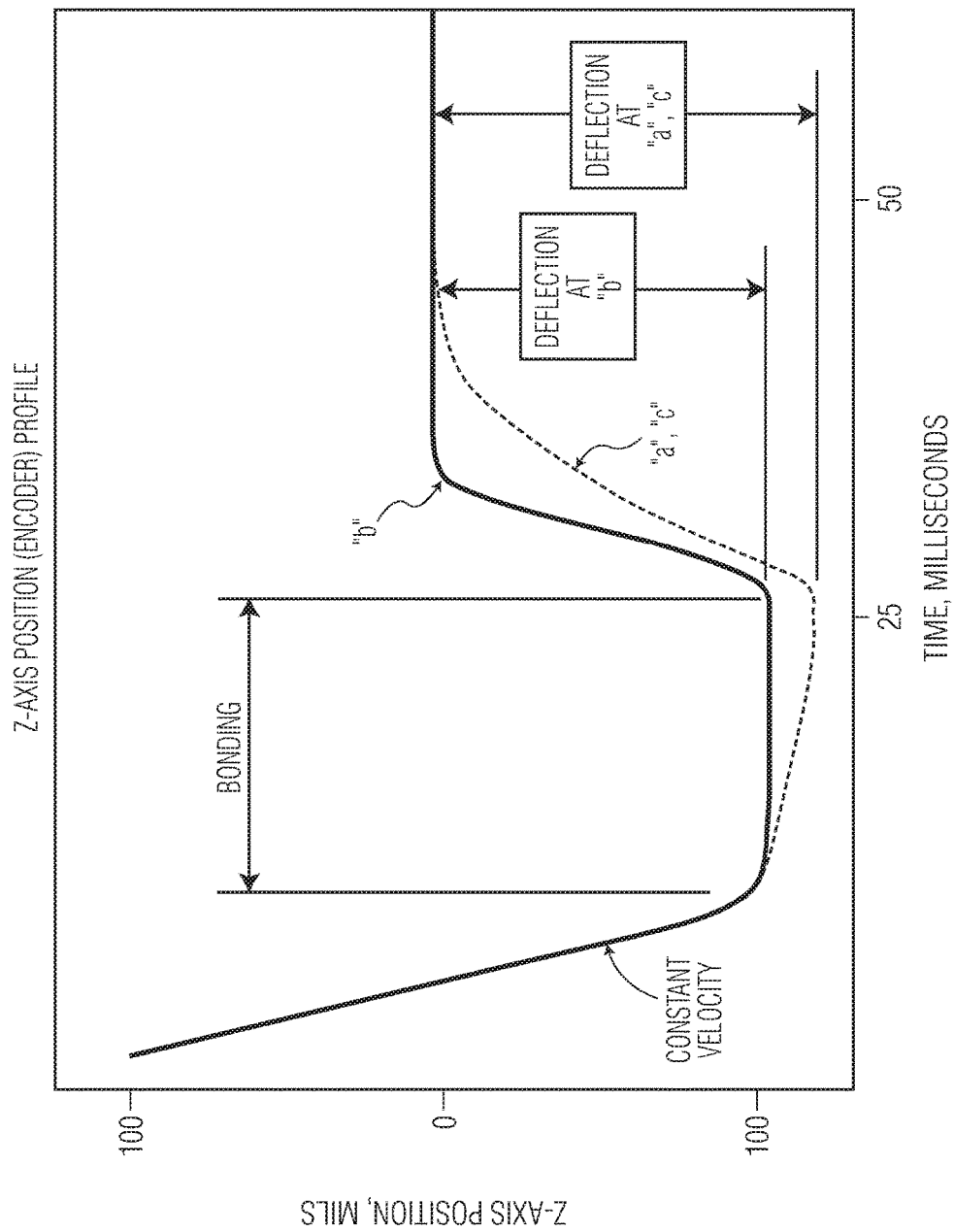

ON-BONDER AUTOMATIC OVERHANG DIE OPTIMIZATION TOOL FOR WIRE BONDING AND RELATED METHODS

CROSS-REFERENCE TO RELATED APPLICATION

This application claims the benefit of U.S. Provisional Application 62/250,745, filed Nov. 4, 2015, the contents of which are incorporated herein by reference.

FIELD

The invention relates to the wire bonding operations, and more particularly, to improved methods of determining wire bond program parameters for use in connection with overhang die applications.

BACKGROUND

In the semiconductor packaging industry, wire bonding continues to a primary method of providing electrical interconnection between two (or more) locations within a package. In a typical wire bonding application, a wire bonding tool (e.g., a capillary bonding tool in a ball bonding application, a wedge bonding tool in a wedge bonding application, etc.) is used to bond a first end of wire to a first bonding location to form a first bond. Then, a length of wire continuous with the first bond is extended toward a second bonding location. Then, a second bond (continuous with the first bond and the length of wire) is formed at the second bonding location. Thus, a wire loop is formed between the first bonding location and the second bonding location. During formation of wire bonds various types of energy (e.g., ultrasonic, thermosonic, thermocompressive, etc.) may be used, in connection with bond force and/or heat.

In certain types of semiconductor packages, various semiconductor dies are arranged in a "stacked die" configuration. In such packages, one or more of the dies may overhang other dies (or spacers, substrates, etc.). FIG. 1 illustrates such a package. In FIG. 1, a lower semiconductor die 102 is supported by a substrate 100 (where a wire loop 108 provides interconnection between a bonding location on die 102 and another bonding location on substrate 100). A spacer 104 is positioned between lower semiconductor die 102 and an upper semiconductor die 106. Upper semiconductor die 106 includes an unsupported portion that hangs over spacer 104 and lower semiconductor die 102. As such, upper semiconductor die 106 may be termed an "overhang die".

In FIG. 1, it is desirable to form another wire loop between upper semiconductor die 106 and another location (e.g., substrate 100). FIG. 1 illustrates the beginning of the bonding process, as a ball bond 112 is being bonded (as a first bond) to a bonding location on upper semiconductor die 106 using a wire bonding tool 110 (where wire bonding tool 110 is carried by a bond head assembly 114). Because upper semiconductor die 106 is an overhang die, the die bends (i.e., die deflection, as shown in FIG. 1). This die deflection can result in damage to the overhang die itself (e.g., cracking, etc.) or damage through contact with other structures below the overhang die (e.g., such as wire loop 108).

Thus, it would be desirable to provide improved methods of controlling potential damage in connection with wire bonding in overhang die applications.

SUMMARY

According to an exemplary embodiment of the invention, a method of providing a z-axis force profile applied to a plurality of bonding locations during a wire bonding operation is provided. The method includes: (a) determining a z-axis force profile for each of a plurality of bonding locations on an unsupported portion of at least one reference semiconductor device; and (b) applying the z-axis force profile during subsequent bonding of a subject semiconductor device.

According to another exemplary embodiment of the invention, a method of determining a maximum bond force to be applied to a bonding location during formation of a wire bond is provided. The method includes: (a) providing a maximum z-axis deflection value for at least one reference semiconductor device; (b) measuring z-axis deflection values at a plurality of bonding locations on at least one reference semiconductor device at a plurality of bond force values; and (c) determining the maximum bond force for each of the bonding locations.

According to yet another exemplary embodiment of the invention, a method of determining a z-axis constant velocity profile for formation of a wire bond is provided. The method includes: (a) providing a maximum z-axis deflection value for a semiconductor device; (b) measuring z-axis deflection values at a plurality of bonding locations on at least one reference semiconductor device at a plurality of z-axis constant velocity profiles; and (c) determining a z-axis constant velocity profile for each of the bonding locations.

According to yet another exemplary embodiment of the invention, a method of determining a maximum bonded ball diameter is provided. The method includes: (a) determining a maximum bond force for a bonding location for the formation of wire bonds; (b) determining a z-axis constant velocity profile for formation of wire bonds at the bonding location; and (c) determining, on a computer, a maximum bonded ball size for the bonding location using the maximum bond force determined in step (a) and the z-axis constant velocity profile in step (b).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 5B is a timing diagram illustrating a z-axis position of a portion of a bond head assembly of a wire bonding machine during formation of wire bonds at various locations of the overhang die of FIG. 5A in accordance with an exemplary embodiment of the invention;

DETAILED DESCRIPTION

Figure 1:
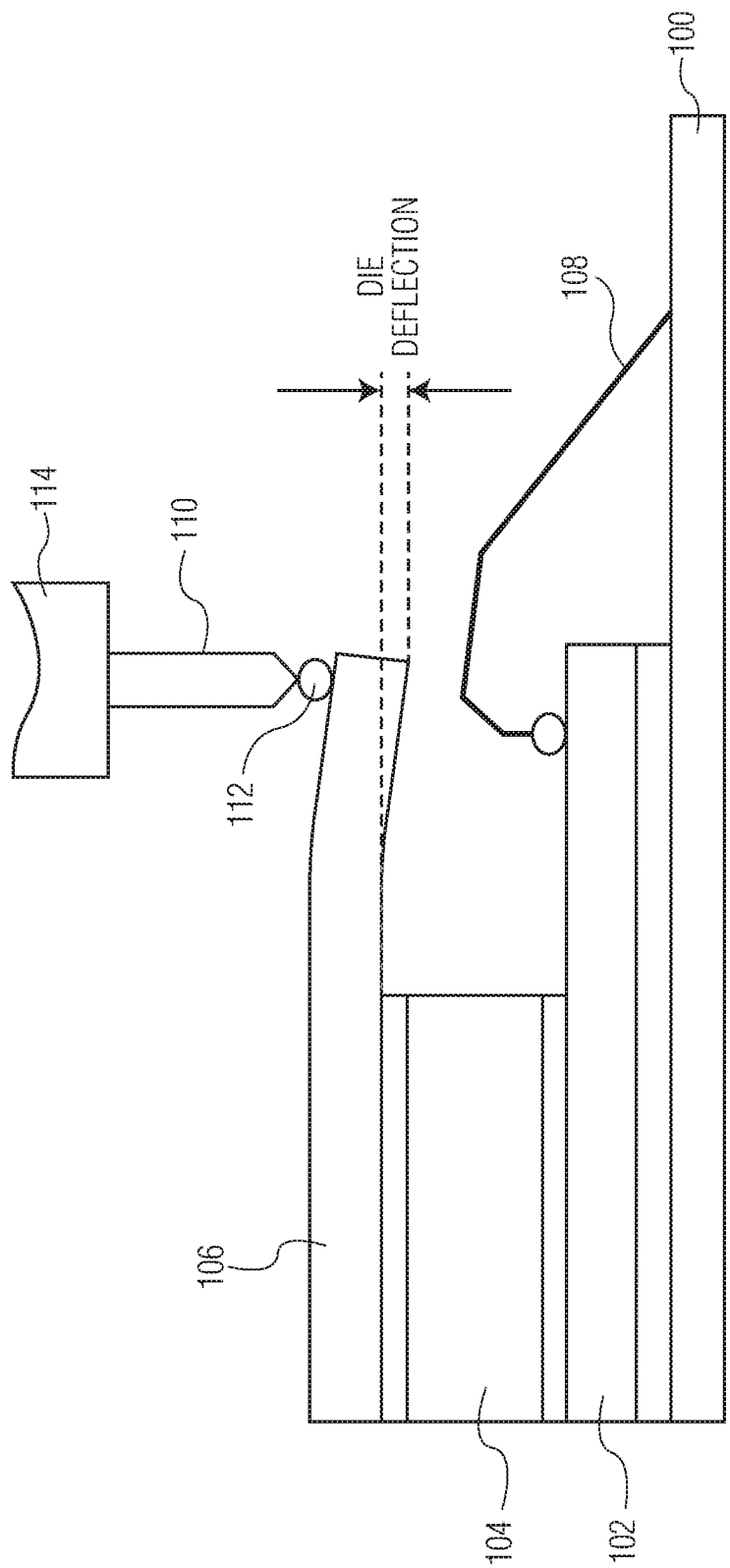
FIG. 1 is a block diagram side view of a portion of a conventional stacked die device including an overhang die.

As used herein, the term "z-axis force profile" refers to a force to be applied in connection with a wire bonding operation (or a portion of a wire bonding operation) along a z-axis during a time period. Such a profile may be provided in a number of formats including but not limited to, for example, a graphical format (e.g., see FIG. 4), a tabular format (e.g., a series of force values at increments of time), etc. Such a force profile may be provided for an entire bonding cycle (such as the graph in FIG. 4), or may be provided for part of a bonding cycle (e.g., during the force ramp down, leading to lift off, corresponding to the dotted line portion of FIG. 3).

In accordance with certain exemplary embodiments of the invention, system and methods that automatically determine (e.g., compute) wire bonding parameters such as optimal damping gain (e.g., a force profile during force ramp down after bonding related to the wire bonding tool coming off the die in a predictable manner), maximum die settle time, maximum safe contact velocity (e.g., in a constant velocity mode), and maximum safe bond force are provided for an overhang (overhanging) semiconductor device on a wire bonder (i.e., a wire bonding machine). Such parameters may be provided specific to each bonding location on the overhang semiconductor device (e.g., an overhang semiconductor die).

When a wire bonding tool (carried by a bond head assembly of a wire bonding machine) makes contact with a bond pad (or other bonding location) on an unsupported portion of an overhang die (or another overhang semiconductor device), the die surface deflects downwards. This deflection may cause a number of issues with wire bonding and loop shaping, for example, due to die vibration when the wire bonding tool lifts off of the die surface after bonding. Characterizing and optimizing a wire bond process for an overhang die is therefore extremely difficult and tedious. Certain aspects of the invention relate to automatically performing an in situ characterization and optimization of an overhang die on a wire bonder. For example, using a z-axis encoder feedback and an iterative method, the key overhang device characteristics may be quantified such as optimal damping gain, maximum die settle time, maximum safe contact velocity and maximum safe bond force for all programmed locations on an overhang die.

In accordance with certain exemplary embodiments of the invention, a bond program is taught with programmed bonding locations on an overhang die. A bonding tool (e.g., a capillary) touches down repeatedly (e.g., with or without wire engaged in the bonding tool) on each programmed bonding location with pre-defined starting values of certain parameters such as damping gain, contact velocity (e.g., in a constant velocity mode) and bond force. The z-axis encoder data is used to provide data which is then collected and analyzed. The data may be compared with user defined values (e.g., allowable die deflection, desired bond force, etc.) to determine the maximum die deflection and maximum safe bond force. In the subsequent iterations, the maximum safe contact velocity (i.e., in a constant velocity mode), optimal damping gain, and maximum die settle time may be determined. Such a process may be repeated automatically until convergence to a desired die deflection is achieved for all programmed locations (e.g., on a reference semiconductor device), typically in 6-10 iterations per programmed location. The results are displayed and saved to the bond program (e.g., for each programmed bonding location of a die) from where they can be used automatically during live wire bonding (e.g., on subject semiconductor devices).

Using these inventive techniques, feedback (e.g., instantaneous or real time feedback) may be provided to the wire bonder and user on the overhang device characterization. Thus, optimized key bonding parameters such as damping gain, maximum die settle time, contact velocity and bond force may automatically be determined for each bonding location on an overhang die.

In determining the optimal damping gain for each bonding location, the process should generate a force profile (e.g., a profile of bond force versus time during force ramp down after bonding, a profile of bond force versus time during initial contact before bonding, etc.) that reduces potential oscillation, but also maintains a minimal die settle time such that the UPH (i.e., units per hour) processed during the wire bonding process is not adversely affected.

In determining (1) a maximum bond force during bonding, and/or (2) a z-axis constant velocity profile for formation of a wire bond, a user of the wire bonding machine may enter a maximum deflection of the overhang die (e.g., where the entered maximum deflection does not result in problems such as the overhang die striking a wire loop beneath the overhang die, where the maximum deflection does not result in damage to the die such as die cracking, etc.). In another example, the wire bonding machine may automatically determine the maximum deflection of the overhang die (e.g., a maximum deflection value that does not result in damage to the die such as die cracking, as determined by the wire bonding machine). During an iterative process, the wire bonder measures the z-axis position (e.g., using the z-axis encoder of the bond head of the wire bonding machine) and provides z-axis position data related to applied bond force and a constant velocity (CV) profile. Using this data, the maximum bond force, and the maximum CV profile may be determined.

Figure 2:
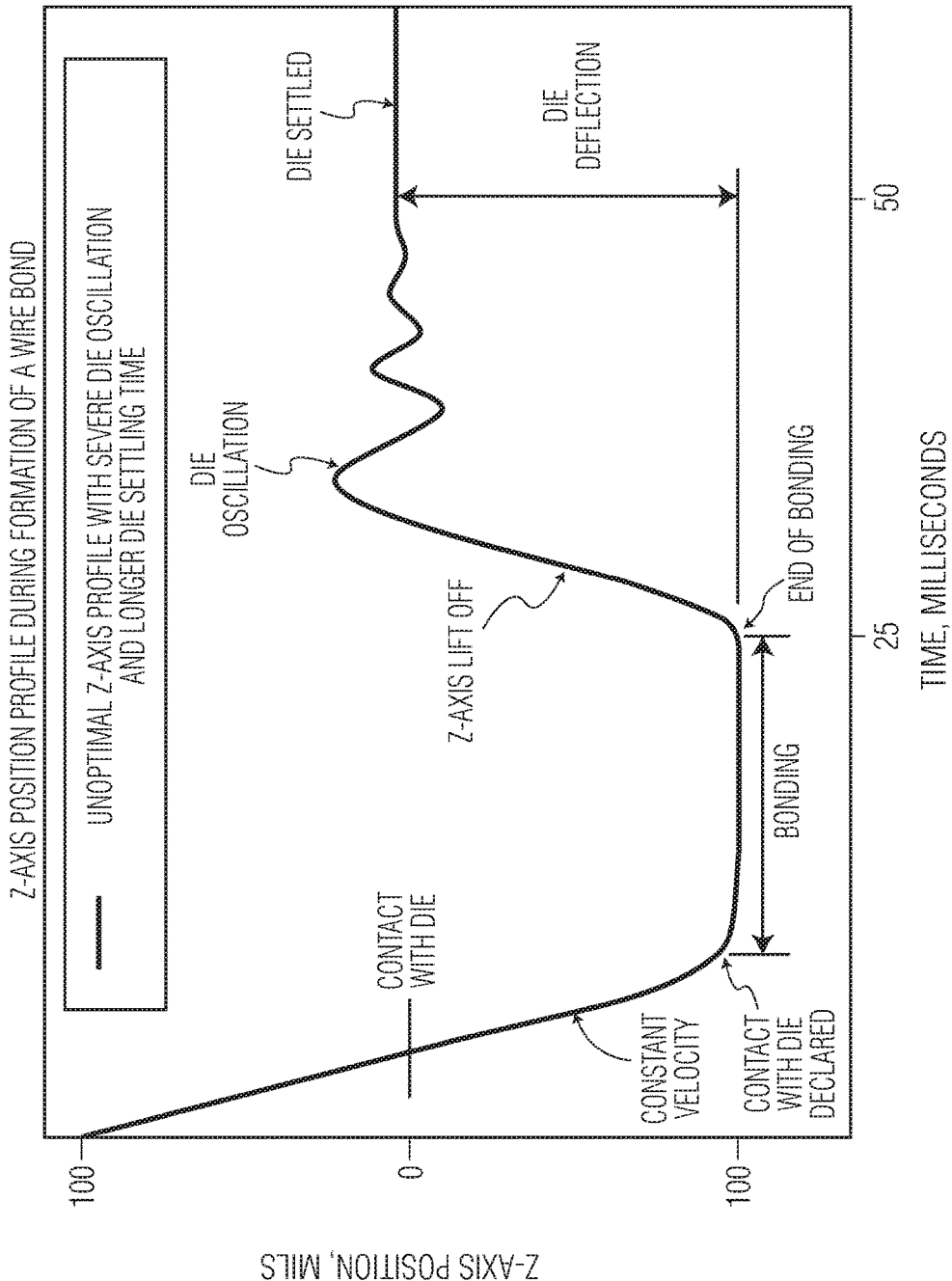
FIG. 2 is a timing diagram illustrating a z-axis position profile of a portion of a bond head assembly of a wire bonding machine during formation of first bond of a wire loop useful in illustrating various exemplary embodiments of the invention.

FIG. 2 illustrates a z-axis position of the bond head assembly (where the bond head assembly carries the wire bonding tool) of a wire bonding machine during formation of a wire bond (e.g., a first bond of a wire loop, such as a ball bond formed with a free air ball). As will be appreciated by those skilled in the art, the z-axis of a wire bonding machine is a vertical axis (or a substantially vertical axis) along which a wire bonding tool travels. The z-axis position may be detected using a z-axis encoder of the wire bonding machine or another technique. As shown in FIG. 2, the wire bonding tool descends along the z-axis in a constant velocity mode ("CONSTANT VELOCITY" in FIG. 2). During this descent there is contact with the die ("CONTACT WITH DIE" in FIG. 2). The descent continues after contact with the die, because of the overhang nature of the die. Then contact with the die is declared ("CONTACT WITH DIE DECLARED" in FIG. 2), and the "BONDING" process begins. After the bonding process is completed, the wire bonding tool is raised, along with a force ramp down from bond force to a reduced level of force (e.g., shown as "Z-AXIS LIFT OFF" in FIG. 2) after the "END OF BONDING". For example, 20 grams of bond force may be applied during bonding, but a reduced force might be 2 grams. In terms of time, it would be desirable to accomplish the force ramp down as soon as possible; however, because of the overhang nature of the die, die oscillation results as shown in FIG. 2. After a period of time, the die settles (the oscillation stops, see "DIE SETTLED" in FIG. 2) and the die is at the equilibrium position. A problem is that the die oscillation may cause damage to the overhang die (e.g., cracking), damage to wire loops bonded to the overhang die, damage to wire loops below the overhang die, etc.

Figure 3:
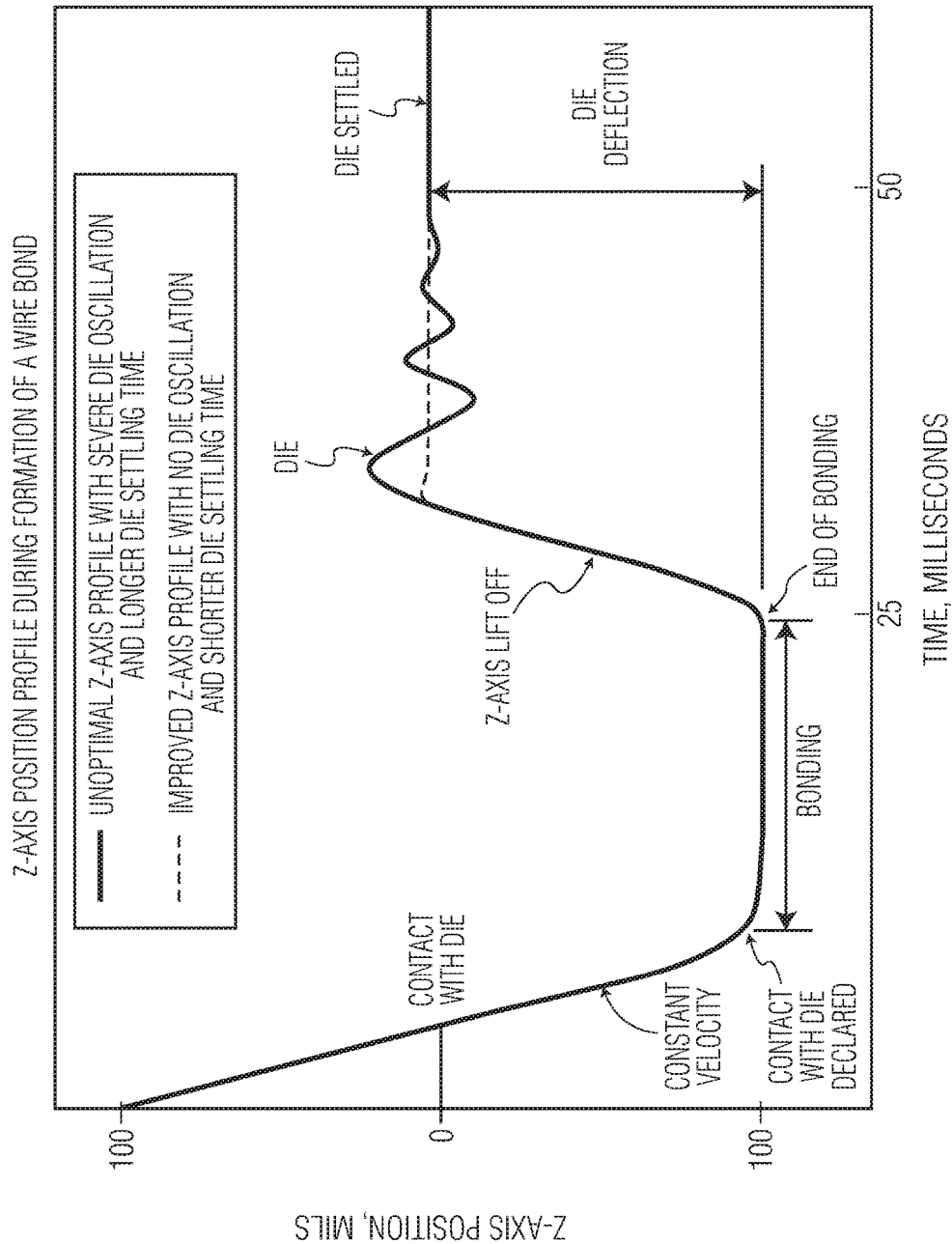
FIG. 3 is a timing diagram illustrating a z-axis position profile of a portion of a bond head assembly of a wire bonding machine during formation of first bond of a wire loop in accordance with an exemplary embodiment of the invention.

FIG. 3 is substantially similar to FIG. 2, except that in FIG. 3, a second curve is shown (the dotted line curve) where the force ramp down has been adjusted (e.g., a desirable z-axis force profile has been applied) such that the die oscillation has been substantially reduced. That is, instead of a quick removal of the bond force (e.g., from 20 grams to 2 grams as in the example described above), a z-axis force profile is applied particular to the bonding location. For example, a more gradual reduction of bond force might be utilized during the force ramp down phase (after "END OF BONDING"), as shown in the dotted line portion of the curve in FIG. 3, as compared to the solid curve. This force profile should be balanced such that an excessive time is not used, reducing UPH (units per hour).

Figure 4:
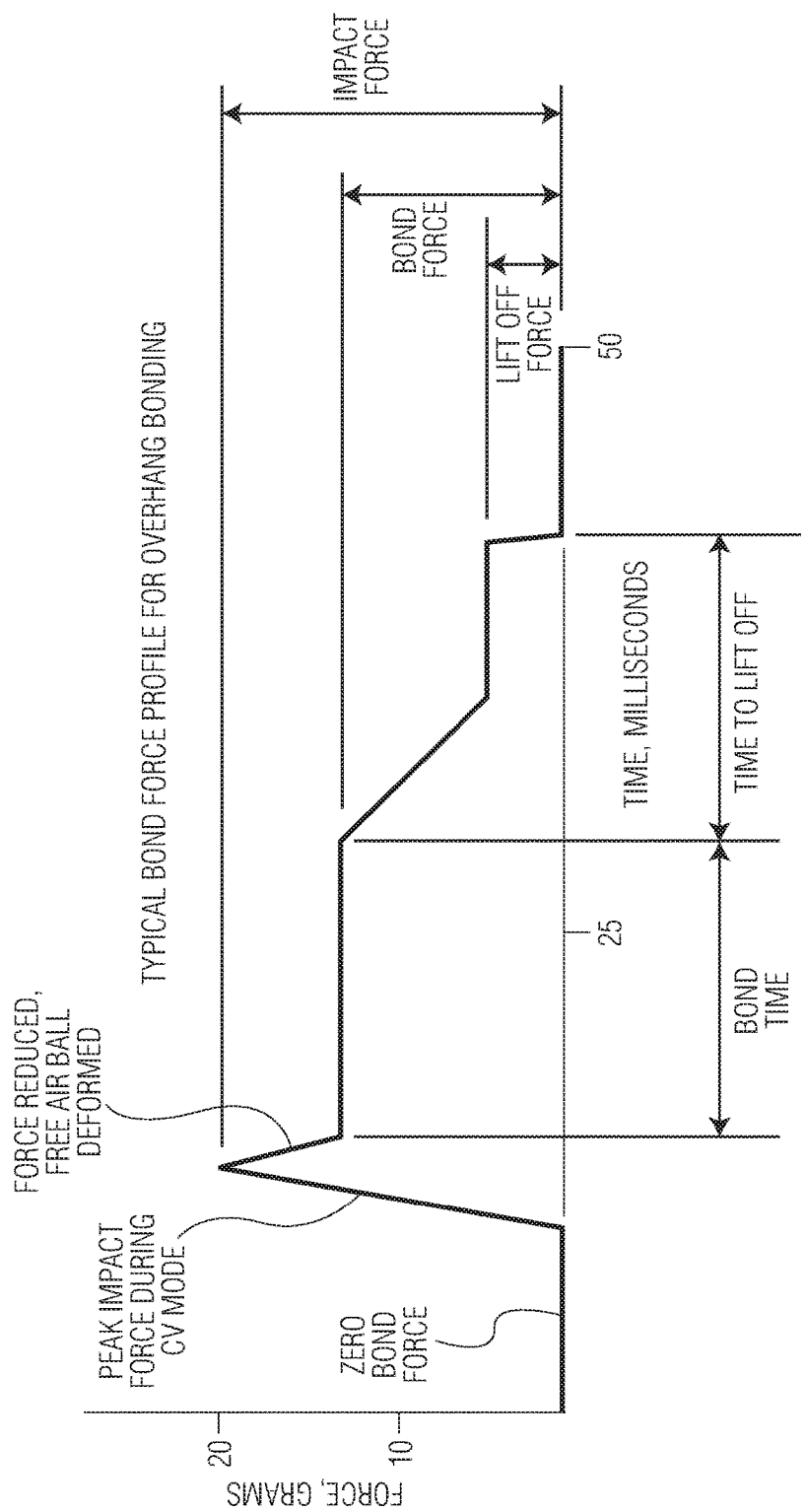
FIG. 4 is a force profile illustrating a force applied by a bonding tool of a wire bonding machine during formation of a wire bond useful in illustrating various exemplary embodiments of the invention.

FIG. 4 illustrates an example bond force profile during bonding (bonding of a free air ball as a first bond of a wire loop, or as a bump) of an overhang die. This bond force profile, or any portion of this bond force profile, may be termed a z-axis force profile. Such a bond force profile gives rise to a z-axis position profile (such as the examples shown in FIGS. 2-3). The bond force profile of FIG. 4 begins at a zero value bond force (no contact, shown as "ZERO BOND FORCE" in FIG. 4) and increases upon contact, and reaches a peak impact force in CV (constant velocity) mode. After deformation of the free air ball, the force is reduced somewhat to a "BOND FORCE" which is applied as a substantially uniform bond force during the "BOND TIME" in FIG. 4. Then the "TIME TO LIFT OFF" occurs during which the force is ramped down from the "BOND FORCE" to a "LIFT OFF FORCE". The force remains at this low level of force such that the overhang die can settle. Then the force is reduced to the zero bond force level. In accordance with certain exemplary embodiments of the invention, a z-axis force profile is generated for each bonding location during the "TIME TO LIFT OFF" period shown in FIG. 4 (and/or during initial contact during the "PEAK IMPACT FORCE DURING CV MODE" phase shown in FIG. 4, and/or during other portions of a wire bonding operation), for example, to reduce oscillation as shown in the dotted line in FIG. 3.

Figure 5A:
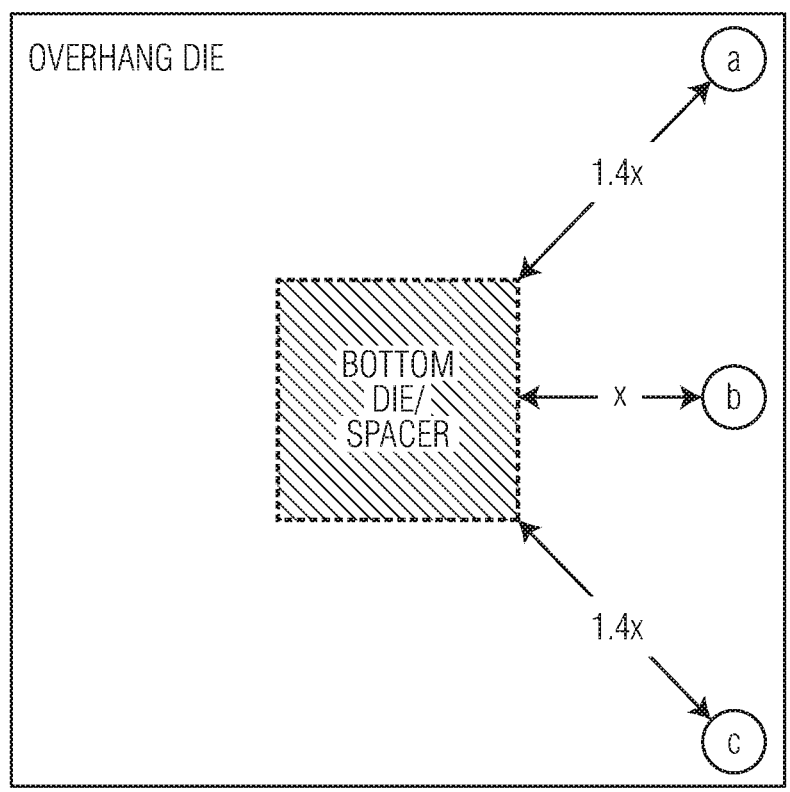
FIG. 5A is a simplified overhead block diagram view of an overhang die including three bonding locations useful in illustrating various exemplary embodiments of the invention.
Figure 5C:
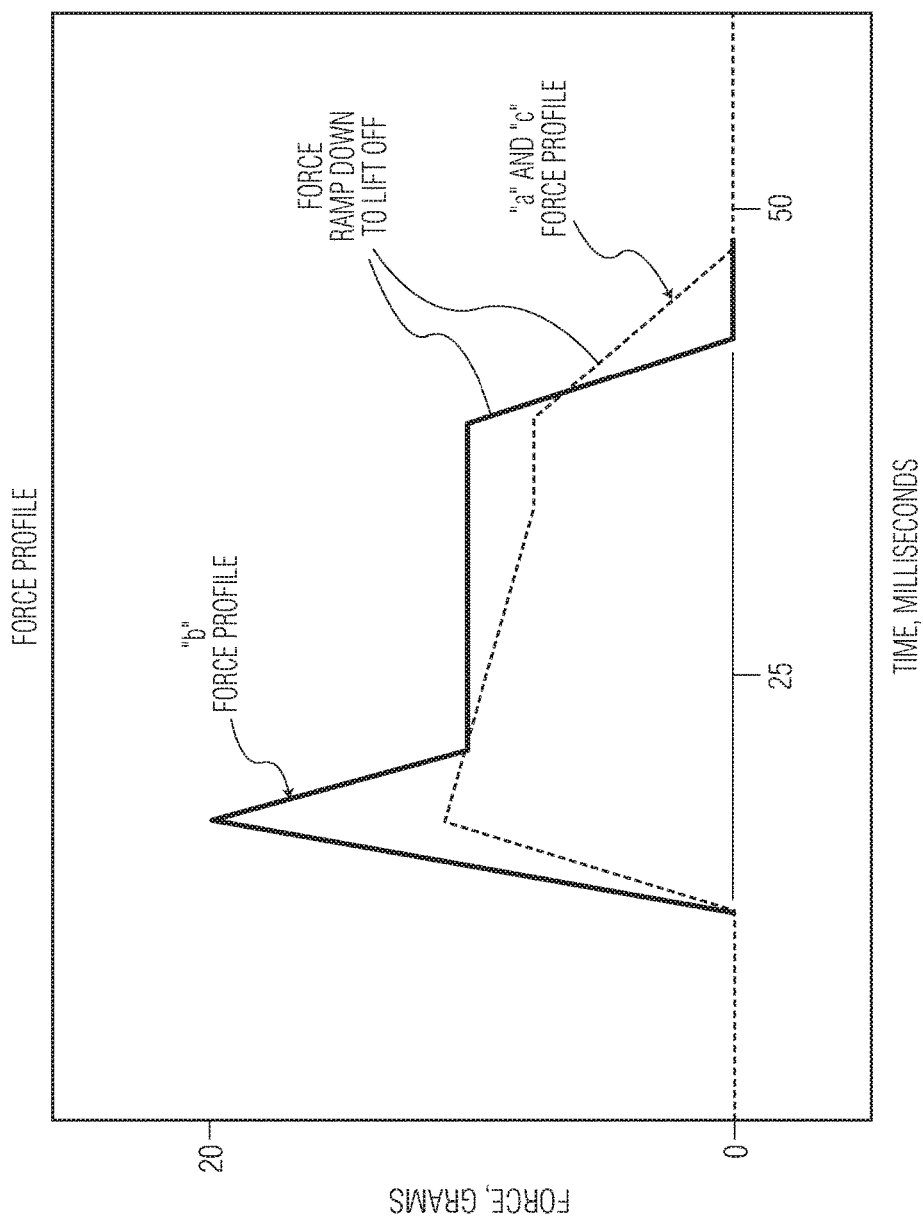
FIG. 5C is a bond force profile illustrating a bond force applied by a wire bonding tool of a wire bonding machine during formation of wire bonds at various locations of the overhang die of FIG. 5A in accordance with an exemplary embodiment of the invention.

In accordance with certain exemplary embodiments of the invention, each bonding location may be considered independently, and a z-axis force profile is generated for that unique bonding location (e.g., including a force ramp down profile after bonding, or a force profile during initial impact, etc.). FIG. 5A illustrates a simple overhang die positioned above a bottom die/spacer having a smaller footprint compared to the overhang die. The overhang die includes three bonding locations (i.e., "a", "b", and "c"). As shown in FIG. 5A, locations "a" and "c" are a distance 1.4x from the bottom die, while location "b" is a smaller distance "x" from the bottom die. Thus, the overhang die would tend to be stiffer at location "b", and would deflect more under a uniform force application at locations "a" and "c". It is often desirable to apply a consistent level of amount of bond force and CV for all bonding locations during the actual bonding. Thus, as shown in the z-axis position profile in FIG. 5B (similar to the z-axis position profile of FIG. 3), the z-axis position during "BONDING" is lower for locations "a" and "c" because the same bond force is applied to bonding locations "a" and "c" as compared to location "b". That z-axis position profile for bonding locations "a" and "c" is shown in dotted lines in FIG. 5B (any unacceptable level of die oscillation is not shown in FIG. 5B for simplicity). But such a lower z-axis position for bonding locations "a" and "c" may involve an unacceptable level of die deflection. Thus, bond force ramp down (the force after bonding associated with lift off) may be changed for bonding locations "a" and "c". FIG. 5C illustrates the bond force profiles (which are analogous to the z-axis force profile shown in FIG. 4) for location "b", and for locations "a" and "c". As shown in FIG. 5C, the force ramp down for locations "a" and "c" is much more gradual compared to location "b". This force ramp down, which is specific to each bonding location, allows for a reduction in potential oscillation.

FIGS. 5A-5C are also instructive for the automatic determination of a (1) a maximum bond force during bonding, and/or (2) a z-axis constant velocity profile for formation of a wire bond, in accordance with exemplary embodiments of the invention. That is, because the different bonding locations "a", "b", and "c" deflect differently, an acceptable maximum bond force may be different for each location. Using the user provided maximum deflection value, an iterative approach is used to measure deflection at each bonding location at different levels of bond force. An acceptable maximum bond force may then be determined that may be used for all of the bonding locations. The same approach may be taken to determine an acceptable z-axis constant velocity profile that may be used for all bonding locations, without exceeding the user provided maximum deflection value.

FIGS. 6-9 are flow diagrams in accordance with certain exemplary embodiments of the invention. As is understood by those skilled in the art, certain steps included in the flow diagrams may be omitted; certain additional steps may be added; and the order of the steps may be altered from the order illustrated.

Figure 6:
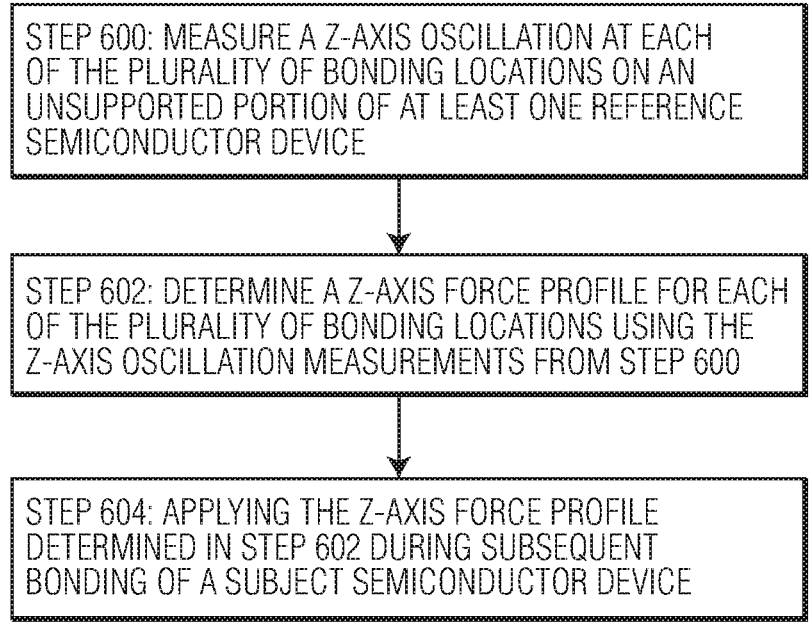
FIG. 6 is a flow diagram illustrating a method of providing a z-axis force profile applied to a plurality of bonding locations during a wire bonding operation in accordance with an exemplary embodiment of the invention.

FIG. 6 is a flow diagram illustrating a method of providing a z-axis force profile (such as the force profile shown in FIG. 4 or FIG. 5C) applied to a plurality of bonding locations during a wire bonding operation. At Step 600, a z-axis oscillation is measured at each of the plurality of bonding locations on an unsupported portion of at least one reference semiconductor device. For example, the z-axis oscillation may be measured (e.g., using a z-axis encoder of a bond head of a wire bonding machine) at each of the plurality of bonding locations at a plurality of z-axis force values in connection with the determination of the z-axis force profile for each of the plurality of bonding locations.

In a specific example, the z-axis oscillation may be measured in connection with an iterative process such that the z-axis force profile is determined for each of the bonding locations that will result in a desirable z-axis deflection profile for each bonding location (e.g., such that a maximum deflection value included in the z-axis deflection profile is below a predetermined threshold). At Step 602, a z-axis force profile is determined for each of the plurality of bonding locations using the z-axis oscillation measurements from Step 600 (e.g., using the iterative process to determine a z-axis force profile resulting in an acceptable z-axis deflection profile, where a maximum deflection value of the acceptable z-axis deflection profile is below a predetermined threshold.). At Step 604, the z-axis force profile determined in Step 602 is applied during subsequent bonding of a subject semiconductor device. That is, Steps 600 and 602 may be performed in connection with a reference semiconductor device(s), and may be performed with (or without) wire engaged with the wire bonding tool. At Step 604, actual wire bonding is performed in connection with subject semiconductor devices (e.g., devices in production), using the z-axis force profile determined in Step 602.

Figure 7:
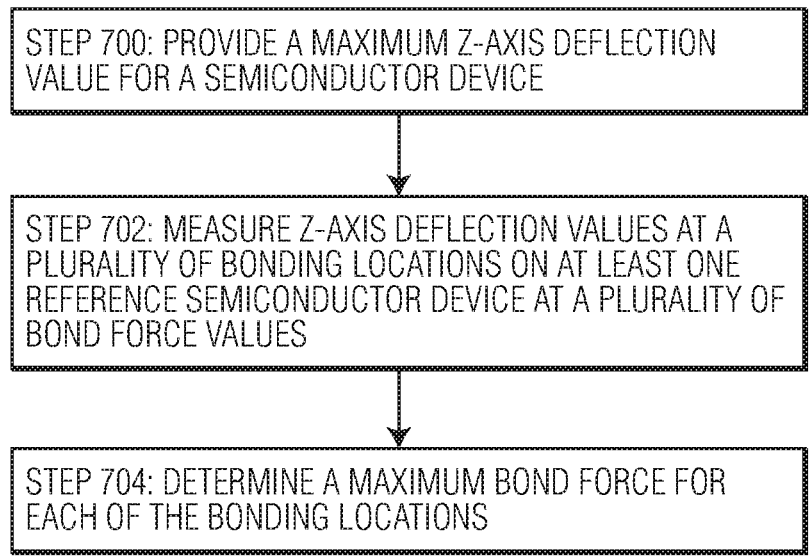
FIG. 7 is a flow diagram illustrating a method of determining a maximum bond force to be applied to a bonding location during formation of a wire bond in accordance with an exemplary embodiment of the invention.

FIG. 7 is a flow diagram illustrating a method of determining a maximum bond force to be applied to a bonding location during formation of a wire bond. At Step 700, a maximum z-axis deflection value is provided for at least one reference semiconductor device. Such a maximum z-axis deflection value may be provided in a number of methods. In certain examples, a user of the wire bonding machine may provide the maximum deflection of the overhang die, for example: the user may identify the maximum deflection through testing and experimentation such that the maximum deflection does not result in problems such as (i) the overhang die striking a wire loop beneath the overhang die, and/or (ii) damage to the die such as die cracking. In another example, the wire bonding machine may automatically determine the maximum deflection of the overhang die (e.g., a maximum deflection value that does not result in damage to the die such as die cracking, as determined by the wire bonding machine through a process wherein varying levels of die deflection are tested, for example, using a z-axis encoder, and die crack can be identified by the machine because the die does not properly restore after some amount of deflection). At Step 702, z-axis deflection values are measured at a plurality of bonding locations on at least one reference semiconductor device at a plurality of bond force values. For example, such deflection values may be measured using a z-axis encoder of the wire bonding machine. Steps 702 may be performed in connection with (or without) wire engaged with the wire bonding tool. At Step 704, the maximum bond force is determined for each of the bonding locations: that is, the maximum deflection value from Step 700, and the z-axis deflection values measured at Step 702 at multiple bond force values, are used to determine an acceptable maximum bond force value. Step 704 may include determining the maximum bond force as a single value that may be applied to each of the bonding locations, or may include determining the maximum bond force as a plurality of values, each of the bonding locations having a corresponding maximum bond force included in the plurality of values.

Figure 8:
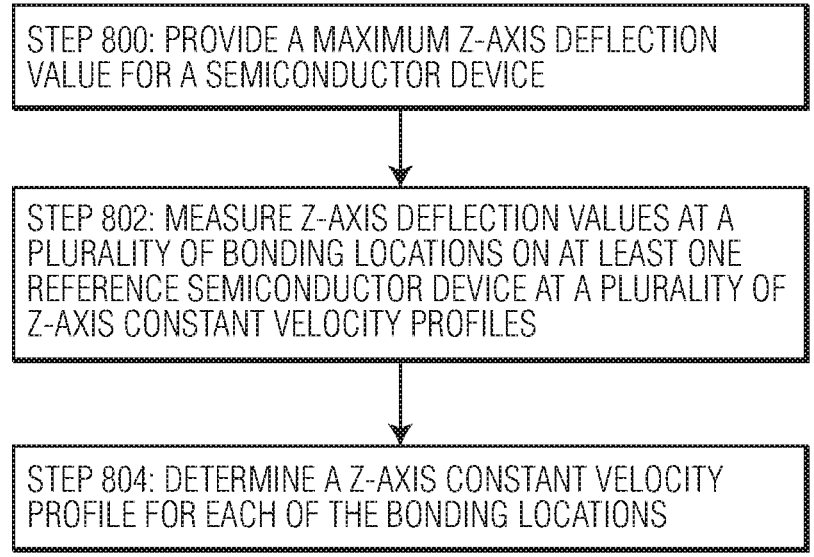
FIG. 8 is a flow diagram illustrating a method of determining a z-axis constant velocity profile for formation of a wire bond in accordance with an exemplary embodiment of the invention.

FIG. 8 is a flow diagram illustrating a method of determining a z-axis constant velocity profile (e.g., which may be a z-axis slope during a predetermined period of time) for formation of a wire bond. At Step 800, a maximum z-axis deflection value for a semiconductor device is provided. Such a maximum z-axis deflection value may be provided as described above in connection with Step 700 of FIG. 7. At Step 802, z-axis deflection values are measured at a plurality of bonding locations on at least one reference semiconductor device at a plurality of z-axis constant velocity profiles. As provided above with respect to Step 702 of FIG. 7, such deflection values may be measured using a z-axis encoder of the wire bonding machine. At Step 804, a z-axis constant velocity profile is determined for each of the bonding locations: that is, the maximum deflection value from Step 800, and the z-axis deflection values measured at Step 802 at multiple z-axis constant velocity profiles, are used to determine an acceptable z-axis constant velocity profile at Step 804. Step 704 may include determining the z-axis constant velocity profile as a single profile that may be applied to each of the bonding locations, or may include determining the z-axis constant velocity profile as a plurality of profiles, each of the bonding locations having a corresponding z-axis constant velocity profile included in the plurality of profiles.

Figure 9:
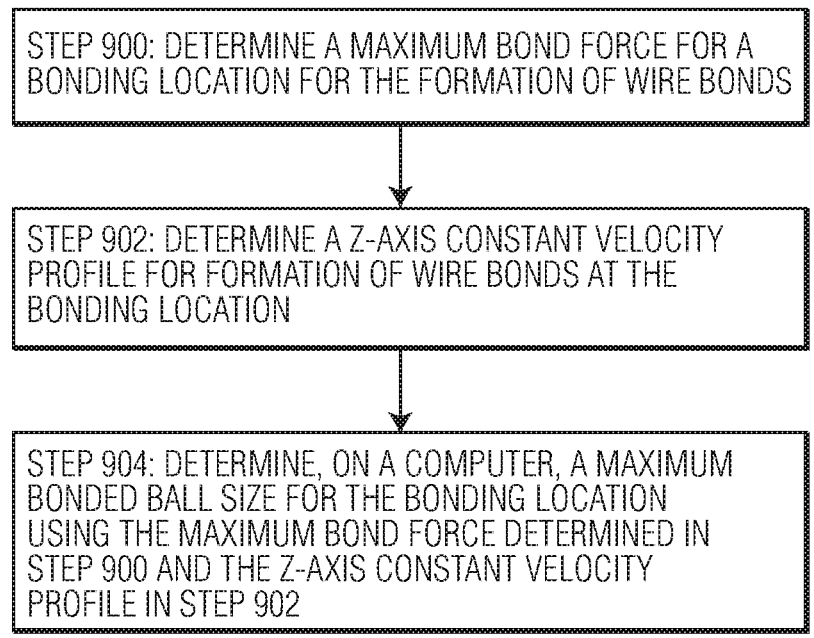
FIG. 9 is a flow diagram illustrating a method of determining a maximum bonded ball diameter in accordance with an exemplary embodiment of the invention.

FIG. 9 is a flow diagram illustrating a method of determining a maximum bonded ball diameter. In certain wire bonding applications, a free air ball is bonded to a bonding location to formed a bonded ball. The diameter of this bonded ball is an important characteristic of the wire bond, and may be used as an input to derive bonding parameters for forming a wire bond (See, e.g., U.S. Patent Application Publication No. 2012/0074206). Thus, it may be important to know the maximum bonded ball diameter that is possible in a given application, including overhang die applications. At Step 900, a maximum bond force applied to a bonding location for the formation of a wire bond is determined. For example, the maximum bond force may be determined using the method disclosed in FIG. 7. At Step 902, a z-axis constant velocity profile for formation of a wire bond at the bonding location is determined. For example, the z-axis constant velocity profile may be determined using the method disclosed in FIG. 8. At Step 904, a maximum bonded ball size for the bonding location is determined, on a computer, using the maximum bond force determined in Step 900 and the z-axis constant velocity profile in Step 902. The computer may be, for example, a computer on a wire bonding machine, or a separate computer system. Step 904 may includes using at least one data structure (e.g., look-up tables, databases, etc.) accessible by the computer, where the data structure(s) includes values related to a maximum bonded ball size, along with the maximum bond force and the z-axis constant velocity profile. Such a data structure(s) may be used by the computer to determine the maximum bonded ball size.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of a determining a maximum bond force to be applied to a bonding location during formation of a wire bond, the method comprising the steps of:
    (a) providing a maximum z-axis deflection value for a semiconductor device;
    (b) measuring z-axis deflection values at a plurality of bonding locations on at least one reference semiconductor device at a plurality of bond force values; and
    (c) determining the maximum bond force for each of the bonding locations.

2. The method of claim 1 wherein the z-axis deflection values are measured using a z-axis encoder of a bond head assembly of a wire bonding machine.

3. The method of claim 1 wherein step (c) includes determining the maximum bond force as a single value that may be applied to each of the bonding locations.

4. The method of claim 1 wherein step (c) includes determining the maximum bond force as a plurality of values, each of the bonding locations having a corresponding maximum bond force included in the plurality of values.

5. The method of claim 1 wherein step (a) includes a user providing the maximum z-axis deflection value.

6. A method of determining a z-axis constant velocity profile for formation of a wire bond, the method comprising the steps of:
(a) providing a maximum z-axis deflection value for a semiconductor device;
(b) measuring z-axis deflection values at a plurality of bonding locations on at least one reference semiconductor device at a plurality of z-axis constant velocity profiles; and
(c) determining a z-axis constant velocity profile for each of the bonding locations.

7. The method of claim 6 wherein the z-axis deflection values are measured using a z-axis encoder of a bond head assembly of a wire bonding machine.

8. The method of claim 6 wherein step (c) includes determining the z-axis constant velocity profile as a single profile that may be applied to each of the bonding locations.

9. The method of claim 6 wherein step (c) includes determining the z-axis constant velocity profile as a plurality of profiles, each of the bonding locations having a corresponding z-axis constant velocity profile included in the plurality of profiles.

10. The method of claim 6 wherein step (a) includes a user providing the maximum z-axis deflection value.

11. The method of claim 6 wherein the z-axis constant velocity profile is a z-axis slope during a predetermined period of time.

\* \* \* \* \*